US012666798B2

(12) United States Patent
Wang et al.

(10) Patent No.: US 12,666,798 B2
(45) Date of Patent: Jun. 23, 2026

(54) DISPLAY SUBSTRATE AND DISPLAY PANEL

(71) Applicants: Chengdu BOE Optoelectronics Technology Co., Ltd., Chengdu (CN); BOE Technology Group Co., Ltd., Beijing (CN)

(72) Inventors: Tsanghong Wang, Beijing (CN); Hsinwei Huang, Beijing (CN); Chunyang Li, Beijing (CN)

(73) Assignees: CHENGDU BOE OPTOELECTRONICS TECHNOLOGY CO., LTD., Chengdu (CN); BOE TECHNOLOGY GROUP CO., LTD, Beijing (CN)

( * ) Notice: Subject to any disclaimer, the term of this patent is extended or adjusted under 35 U.S.C. 154(b) by 1031 days.

(21) Appl. No.: 17/789,587

(22) PCT Filed: Sep. 23, 2021

(86) PCT No.: PCT/CN2021/119775
§ 371 (c)(1),
(2) Date: Mar. 30, 2023

(87) PCT Pub. No.: WO2023/044638
PCT Pub. Date: Mar. 30, 2023

(65) Prior Publication Data
US 2024/0215316 A1 Jun. 27, 2024

(51) Int. Cl.
*H10K 59/35* (2023.01)
*H10K 59/122* (2023.01)
(52) U.S. Cl.
CPC ......... *H10K 59/122* (2023.02); *H10K 59/352* (2023.02)

(58) Field of Classification Search
CPC .. H10K 59/122; H10K 59/352; H10K 59/353; H10K 59/173
See application file for complete search history.

(56) References Cited

U.S. PATENT DOCUMENTS 9,496,515 B2 11/2016 Chun et al.
2014/0197396 A1* 7/2014 Madigan .............. H10K 59/352
438/34

(Continued)

FOREIGN PATENT DOCUMENTS

CN 106816538 A 6/2017
CN 107768401 A 3/2018
CN 111200068 A 5/2020

*Primary Examiner* — Matthew C Landau
*Assistant Examiner* — David W Ward
(74) *Attorney, Agent, or Firm* — Nath, Goldberg & Meyer; Joshua B. Goldberg

(57) ABSTRACT

A display substrate is provided to include: a base substrate, a pixel defining layer on the base substrate and including openings at intervals; light emitting units correspondingly located at openings. Each light emitting unit includes an anode, a cathode, and a luminescent functional layer including a first sub-layer, orthographic projections of the first sub-layer and a non-opening region of the pixel defining layer on the base substrate partially overlap each other. The first sub-layer extends to a side of the non-opening region away from the base substrate. Carrier mobilities of the first sub-layers of two adjacent light emitting units with different colors is different. Orthographic projections of the first sub-layers of two adjacent light emitting units with different colors on the base substrate do not overlap each other. A display panel is provided to include the display substrate.

18 Claims, 10 Drawing Sheets

(56) References Cited

U.S. PATENT DOCUMENTS

| | | | |
|---|---|---|---|
| 2016/0218150 A1* | 7/2016 | Hack | H10K 59/30 |
| 2017/0054101 A1 | 2/2017 | Pyo et al. | |
| 2017/0155073 A1* | 6/2017 | Kim | H10K 50/125 |
| 2017/0338438 A1* | 11/2017 | Kwon | H10K 59/1213 |
| 2019/0206951 A1* | 7/2019 | Xin | H10K 71/164 |
| 2019/0280238 A1* | 9/2019 | Uemura | H10K 59/80515 |
| 2020/0058709 A1* | 2/2020 | Lee | H10K 59/122 |
| 2020/0161383 A1* | 5/2020 | Kim | H10K 50/171 |
| 2020/0212336 A1* | 7/2020 | Heo | H10K 50/15 |
| 2021/0104584 A1* | 4/2021 | Chang | H10K 59/87 |
| 2021/0305533 A1* | 9/2021 | Tsukamoto | H10K 50/15 |
| 2022/0157896 A1* | 5/2022 | Kim | H10K 50/17 |
| 2022/0376004 A1* | 11/2022 | Kitazawa | H10K 59/879 |

* cited by examiner

A–A (B–B)

A–A (B–B)

A–A (B–B)

DISPLAY SUBSTRATE AND DISPLAY PANEL

This is a National Phase Application filed under 35 U.S.C. 371 as a national stage of PCT/CN2021/119775, filed Sep. 23, 2021, the content which is hereby incorporated by reference in its entirety.

TECHNICAL FIELD

The present disclosure relates to the field of display technology, and in particular to a display substrate and a display panel.

BACKGROUND

An organic light emitting diode (OLED) display screen is lighter and thinner and has a high brightness, a low power consumption, a fast response, a high definition, a good flexibility, and a high light emitting efficiency than a liquid crystal display (LCD) screen, and therefore, may meet the new requirements of consumers on display technology.

With the continuous development of OLED display technology, the requirements on OLED display products are higher and higher.

SUMMARY

The embodiment of the present disclosure provides a display substrate and a display panel.

In a first aspect, an embodiment of the present disclosure provides a display substrate, including: a base substrate; a pixel defining layer on the base substrate, wherein the pixel defining layer includes a plurality of openings therein distributed at intervals; a plurality of light emitting units correspondingly located at the plurality of openings, respectively; wherein at least some light emitting units adjacent to each other have different colors; wherein each light emitting unit includes an anode, a cathode, and a luminescent functional layer between the anode and the cathode; the luminescent functional layer includes a first sub-layer, an orthographic projection of the first sub-layer on the base substrate partially overlaps an orthographic projection of a non-opening region of the pixel defining layer on the base substrate; and the first sub-layer extends to a side of the non-opening region of the pixel defining layer away from the base substrate; and wherein carrier mobility of the first sub-layers of two adjacent ones of the at least some light emitting units with different colors are different, and orthographic projections of the first sub-layers of the two adjacent ones of the at least some light emitting units with different colors on the base substrate do not overlap each other.

In some embodiments, the luminescent functional layer further includes a second sub-layer; the first sub-layer and the second sub-layer are sequentially stacked away from the anode; a projection of the second sub-layer of each light emitting unit on the base substrate at least partially overlaps with a projection of the non-opening region of the pixel defining layer on the base substrate, and the second sub-layer extends to the side of the non-opening region of the pixel defining layer away from the base substrate; and orthographic projections of the second sub-layers of the two adjacent ones of the at least some light emitting units with different colors on the base substrate do not overlap each other.

In some embodiments, in each of the at least some light emitting units, orthographic projections of the first sub-layer and the second sub-layer on the base substrate are coincide with each other; or the orthographic projection of the first sub-layer on the base substrate falls within the orthographic projection of the second sub-layer on the base substrate, and an area of the orthographic projection of the first sub-layer on the base substrate is smaller than an area of the orthographic projection of the second sub-layer on the base substrate.

In some embodiments, in the two adjacent ones of the at least some light emitting units with different colors, a carrier mobility of the first sub-layer of the first light emitting unit is higher than that of a first sub-layer of the second light emitting unit; a carrier mobility of a second sub-layer of the first light emitting unit is lower than that of the first sub-layer of the second light emitting unit; and the second sub-layer of the first light emitting unit further extends to at least a partial area between the first sub-layer of the second light emitting unit and the first sub-layer of the first light emitting unit, thereby forming an extension portion.

In some embodiments, the extension portion is correspondingly located in the non-opening region of the pixel defining layer; and an orthographic projection of the first sub-layer of the second light emitting unit on the base substrate does not overlap an orthographic projection of the extension portion on the base substrate.

In some embodiments, the extension portion is correspondingly located in the non-opening region of the pixel defining layer; the extension portion further extends to a position between the first sub-layer of the second light emitting unit and the pixel defining layer; and an orthographic projection of the first sub-layer of the second light emitting unit on the base substrate partially overlaps an orthographic projection of the extension portion on the base substrate.

In some embodiments, an orthographic projection of the second sub-layer of the second light emitting unit on the base substrate partially overlaps the orthographic projection of the extension portion on the base substrate.

In some embodiments, a closest distance between adjacent boundaries of the first sub-layers of the two adjacent ones of the at least some light emitting units with different colors is in a range of 1 μm to 5 μm.

In some embodiments, a closest distance between adjacent boundaries of the second sub-layers of the two adjacent ones of the at least some light emitting units with different colors is in a range of 1 μm to 5 μm.

In some embodiments, a closest distance between adjacent boundaries of the second sub-layers of the two adjacent ones of the at least some light emitting units with different colors is in a range of 1.5 μm to 4.5 μm.

In some embodiments, two adjacent ones of the at least some light emitting units have the same color; a nearest first distance between adjacent boundaries of openings where the two adjacent light emitting units having the same color are located is smaller than a nearest second distance between adjacent boundaries of openings where the two adjacent light emitting units having different colors are located; and a difference between the second distance and the first distance is in a range of 0.5 μm to 2.5 μm.

In some embodiments, a size of the extension portion along a direction where the two adjacent light emitting units with different colors are arranged is in a range of 2 μm to 5 μm.

In some embodiments, the first light emitting unit includes a green light emitting unit; and the second light emitting unit includes a red light emitting unit.

In some embodiments, the display substrate further includes a blue light emitting unit; wherein any two of the blue light emitting unit, the first light emitting unit and the second light emitting unit are adjacent to each other and the blue light emitting unit, the first light emitting unit and the second light emitting unit are adjacent to each other and connected to each other at a position on the side of the non-opening region of the corresponding pixel defining layer away from the base substrate;

at a position where the blue light emitting unit, the first light emitting unit and the second light emitting unit are adjacent to each other and connected to each other, a first sub-layer and a second sub-layer of the blue light emitting unit are sequentially stacked away from the pixel defining layer; the first sub-layer and the second sub-layer of the first light emitting unit are sequentially stacked away from the pixel defining layer; the first sub-layer and the second sub-layer of the second light emitting unit are sequentially stacked away from the pixel defining layer; and the first sub-layer of the blue light emitting unit, the first sub-layer of the first light emitting unit, and the first sub-layer of the second light emitting unit are sequentially stacked away from the pixel defining layer 2.

In some embodiments, each light emitting unit includes an effective light emitting area, which is defined by the opening in the pixel defining layer; and an orthographic projection of the effective light emitting area of at least one of the first light emitting unit, the second light emitting unit and the blue light emitting unit on the base substrate is rectangular or rounded rectangular, which satisfies at least one of: a size of the effective light emitting area of the first light emitting unit in a range of 14.9 μm×9.4 μm to 30.9 μm×24.62 μm;

a size of the effective light emitting area of the second light emitting unit in a range of 12.8 μm×12.8 μm to 28.5 μm×28.5 μm; and a size of the effective light emitting area of the blue light emitting unit in a range of 18.2 μm×18.2 μm to 34.8 μm×34.8 μm.

In some embodiments, the luminescent functional layer further includes a hole injection layer, a hole transport layer, an electron transport layer, and an electron injection layer; each of these layers is at least partially on the side of the non-opening region of the pixel defining layer away from the base substrate;

the hole injection layer, the hole transport layer, the first sub-layer, the second sub-layer, the electron transport layer, and the electron injection layer are sequentially stacked away from the anode; and the second sub-layer is an exciton generation-radiative transition layer; the first sub-layer is a luminescent auxiliary layer.

In some embodiments, the hole transport layer extends to the side of the non-opening region of the pixel defining layer away from the base substrate; and carrier mobility of the hole transport layers of the two adjacent ones of the at least some light emitting units with different colors are different; and orthographic projections of the hole transport layers of the two adjacent ones of the at least some light emitting units with different colors on the base substrate do not overlap each other.

In some embodiments, the hole transport layers of the plurality of light emitting units extend toward the side of the non-opening region of the pixel defining layer away from the base substrate and are integrally connected to each other.

In some embodiments, the hole injection layers of the plurality of light emitting units extend toward the side of the non-opening region of the pixel defining layer away from the base substrate and are integrally connected to each other; and/or the electron transport layers of the plurality of light emitting units extend toward the side of the non-opening region of the pixel defining layer away from the base substrate and are integrally connected to each other; and/or the electron injection layers of the plurality of light emitting units extend toward the side of the non-opening region of the pixel defining layer away from the base substrate and are integrally connected to each other; and/or the cathodes of the plurality of light emitting units extend toward the side of the non-opening region of the pixel defining layer away from the base substrate and are integrally connected to each other.

In some embodiments, the luminescent functional layer further includes a hole blocking layer between the second sub-layer and the electron transport layer; and the hole blocking layers of the plurality of light emitting units extend toward the side of the non-opening region of the pixel defining layer away from the base substrate and are integrally connected to each other.

In some embodiments, a thickness of the first sub-layer of the second light emitting unit is greater than that of the first sub-layer of the first light emitting unit; and/or, the thickness of the first sub-layer of the first light emitting unit is greater than that of the first sub-layer of the blue light emitting unit; and/or, a thickness of the second sub-layer of the second light emitting unit is greater than that of the second sub-layer of the first light emitting unit; and/or, the thickness of the second sub-layer of the first light emitting unit is greater than that of the second sub-layer of the blue light emitting unit.

In some embodiments, thicknesses of the hole injection layer, the hole transport layer, the hole blocking layer, the electron transport layer, the electron injection layer, and the cathode of each light emitting unit are uniform on the non-opening region of the pixel defining layer.

In a second aspect, an embodiment of the present disclosure further provides a display panel, which includes the display substrate.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. The above and other features and advantages will become more apparent to a person skilled in the art by describing in detail exemplary embodiments thereof with reference to the drawings. In the drawings.

Figure 1:
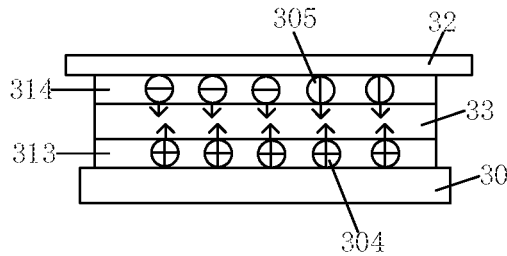
FIG. 1 is a schematic diagram of a light emitting structure and a light emitting principle of an OLED light emitting device.

Reference signs are:

1. base substrate; 2. pixel defining layer; 20. opening; 21. non-opening region; 3. light emitting unit; 30. anode; 31 light emitting functional layer; 310. first sub-layer; 311. second sub-layer; 32. cathode; 300. extension portion: 301. first light emitting unit; 302. second light emitting unit; 303. blue light emitting unit; 312. hole injection layer; 313. hole transport layer; 314. electron transport layer; 315. electron injection layer; 316. hole blocking layer; 33. light emitting layer; 304. holes; 305. electrons; 4. sub-pixel; 41. red OLED light emitting device; 42. green OLED light emitting device; 43. blue OLED light emitting device.

DETAIL DESCRIPTION OF EMBODIMENTS

In order to enable one of ordinary skill in the art to better understand the technical solutions of the embodiments of the present disclosure, a display substrate and a display panel of the embodiment of the present disclosure will be described in further detail with reference to the accompanying drawings and the detailed description.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that this disclosure will be thorough and complete, and will fully convey the scope of the present disclosure to one ordinary skill in the art.

The disclosed embodiments are not limited to the embodiments shown in the drawings, but include modifications of configurations formed based on a manufacturing process. Thus, areas illustrated in the drawings have schematic properties, and shapes of the areas shown in the drawings illustrate specific shapes of the areas, but are not intended to be limiting.

Referring to FIG. 1, an OLED (organic light emitting diode) belongs to a current type organic electroluminescent device, and the OLED device emits light by injection and recombination of carriers, and the light emission intensity thereof is directly proportional to the injected current intensity. A structure of the OLED light emitting device may include: an anode 30, a hole transport layer 313, a luminescent layer 33, an electron transport layer 314, and a cathode 32 sequentially stacked. tinder an electric field for the OLED device, holes 304 generated by the anode 30 and electrons 305 generated by the cathode 32 move, and are injected into the hole transport layer 313 and the electron transport layer 314, respectively, and migrate to the luminescent layer 33; when the holes 304 and the electrons 305 meet in the luminescent layer 33, energized excitons are generated, and undergo radiative transition, thereby producing visible light.

Figure 2:
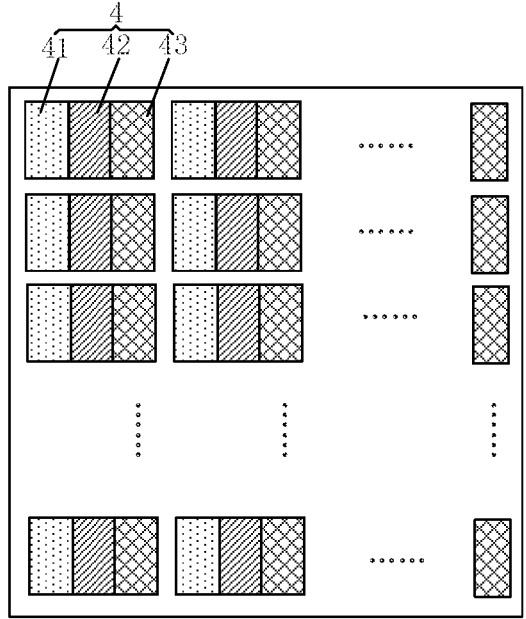
FIG. 2 is a schematic diagram of an arrangement of sub-pixels in an OLED display panel.

Referring to FIG. 2, an OLED display product (e.g., an OLED display panel) may include a plurality of sub-pixels 4 arranged in an array, where each sub-pixel 4 employs one OLED light emitting device; the plurality of sub-pixels 4 are located in regions defined by a pixel defining layer 2. OLED light emitting devices may include red, green, and blue OLED light emitting devices 41, 42, and 43, thereby implementing color display of the OLED display product. As the resolution of the OLED display product is continually improved, a gap between any two adjacent sub-pixels 4 becomes smaller, which causes a lateral leakage of electricity between any two adjacent sub-pixels 4 of different colors to be increased, and thus color shift occurs. Especially, when the OLED display product displays a green picture with a low gray scale, the phenomenon of color shift is severe.

Figure 3:
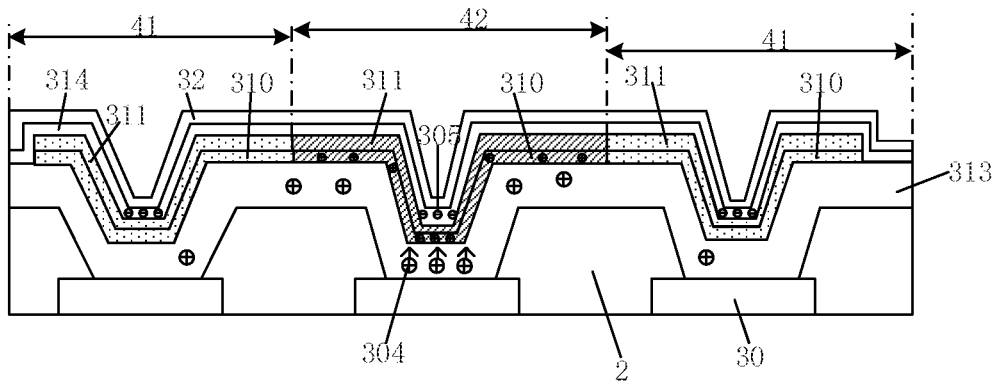
FIG. 3 is a schematic cross-sectional view of adjoining edges of first sub-layers in adjacent OLED light emitting devices in an OLED display panel.
Figure 4:
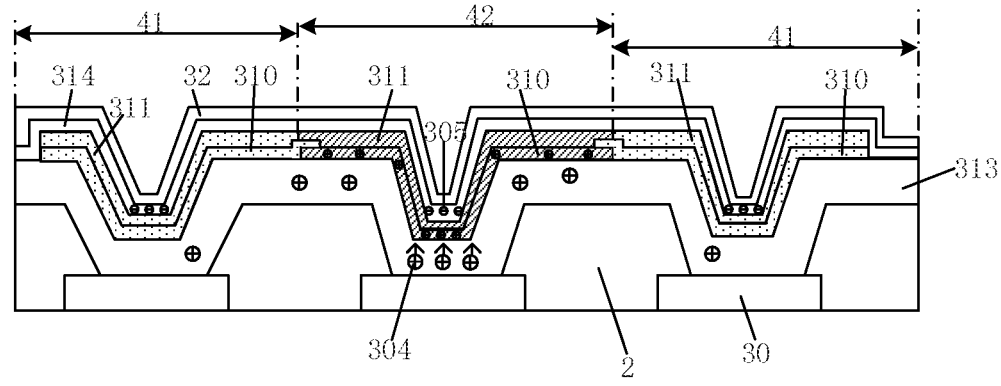
FIG. 4 is a schematic cross-sectional view of lapping edges of first sub-layers in adjacent OLED light emitting devices in an OLED display panel.

Referring to FIGS. 3 and 4, the luminescent layer of each OLED light emitting device may include a first sub-layer 310 and a second sub-layer 311 stacked together, the first sub-layer 310 is closer to the anode 30 than the second sub-layer 311; the first sub-layer 310 facilitates transmission of the holes 304: energized excitons are generated in the second sub-layer 311, and undergo radiative transition, thereby producing visible light. In the OLED display product, edges of the first sub-layers 310 of a red OLED light emitting device 41 and a green OLED light emitting device 42 adjacent to each other adjoin each other, or edges thereof lap over each other; and edges of the second sub-layers 311 of the two OLED light emitting devices on the first sub-layers 310 adjoin each other, or edges of the second sub-layers 311 of the two adjacent OLED light emitting devices are sequentially stacked. When a green picture is independently lighted, the first sub-layer 310 of the green OLED light emitting device 42 may readily transmit the holes 304 to the first sub-layer 310 of the red OLED light emitting device 41 and the first sub-layer 310 of the red OLED light emitting device 41 transmits the holes 304 to the second sub-layer 311 thereof. Cathodes 32 of all the OLED light emitting devices in the OLED display product have a one-piece structure (continuously cover layers below the cathodes 32 as a whole), so that the electrons 305 generated by the cathodes 32 may be transmitted to the second sub-layer 311 of the red OLED light emitting device 41, and meet the holes 304 in the second sub-layer 311 to generate energized excitons, which undergo radiative transition, thereby producing weak red light, which causes the chromaticity shift of the green picture. Especially when the green picture with a low gray scale is independently displayed, the visual effect of the phenomenon of the chromaticity shift is more obvious.

In addition, in order to reduce the complexity and the cost of the procedure for manufacturing the OLED display product, the hole transport layers 313 of all OLED light emitting devices in the OLED display product have a one-piece structure; when the green picture is independently lighted, the hole transport layer 313 of the green OLED light emitting device 42 may also readily transmit the holes 304 to the hole transport layer 313 of the red OLED light emitting device 41, and the hole transport layer 313 of the red OLED light emitting device 41 transmits the holes 304 to the second sub-layer 311 thereof through the first sub-layer 310 thereof. In addition, the electrons 305 generated by the cathode 32 are also transported to the second sub-layer 311 of the red OLED light emitting device 41 and meet the holes 304 in the second sub-layer 311 to generate energized excitons, which undergo radiative transition, thereby producing weak red light, and causing the chromaticity shift of the green picture.

Figure 5:
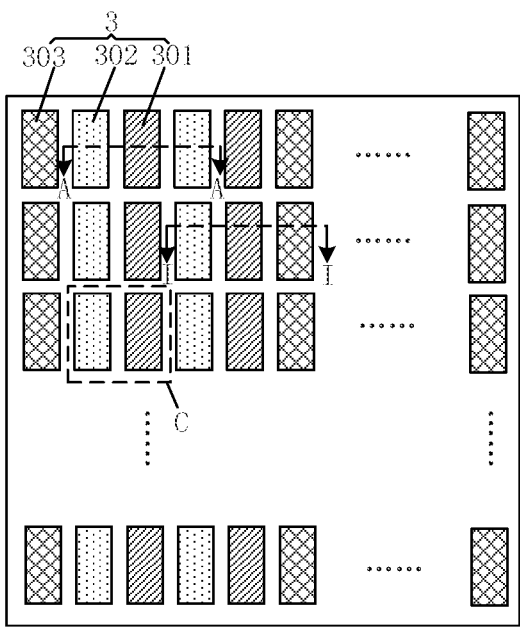
FIG. 5 is a schematic diagram illustrating an arrangement of light emitting units in a display substrate according to an embodiment of the present disclosure.
Figure 6:
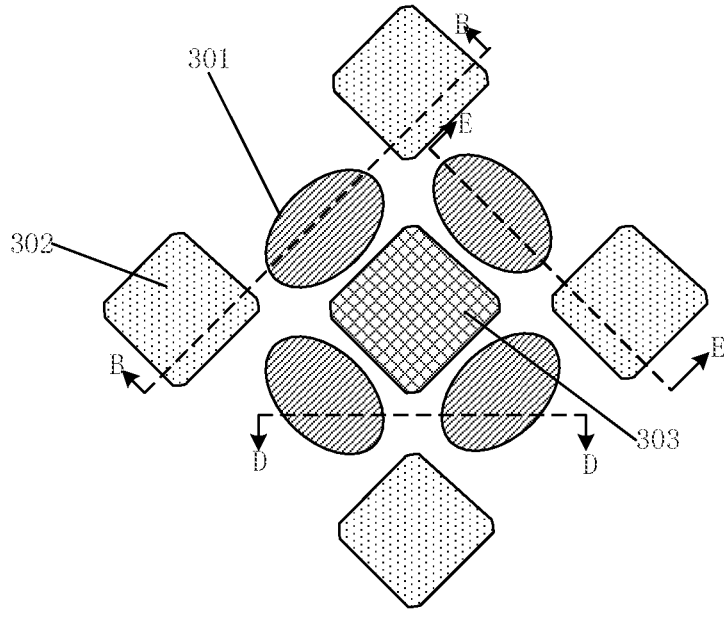
FIG. 6 is a schematic diagram illustrating another arrangement of light emitting units in a display substrate according to an embodiment of the present disclosure.
Figure 7:
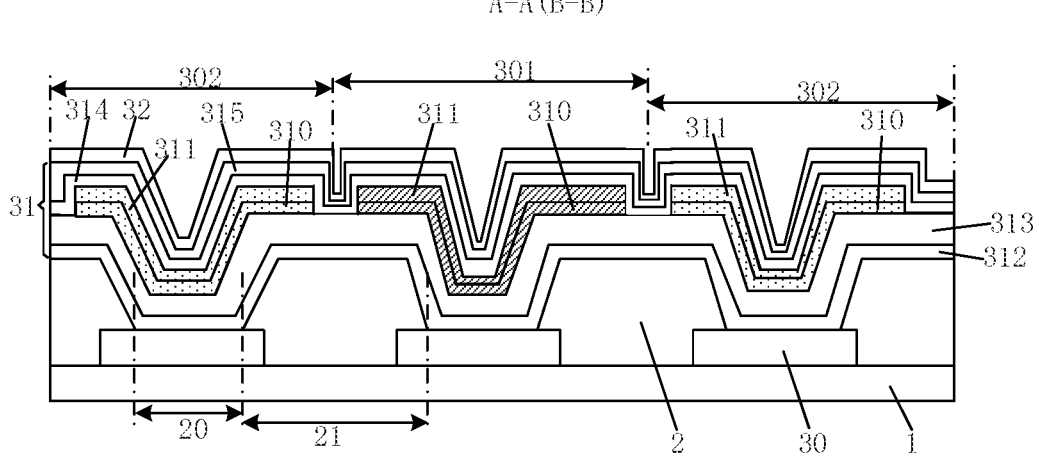
FIG. 7 is a schematic cross-sectional view of a structure showing a display substrate along a cutting line AA in FIG. 5 and a cutting line BB in FIG. 6.

In view of the problem of the chromaticity shift occurring when the OLED display product displays a monochrome picture, an embodiment of the present disclosure provides a display substrate, with reference to FIGS. 5 to 7, including: a base substrate 1; a pixel defining layer 2 on the base substrate 1, in which a plurality of openings 20 are formed and distributed at intervals; and a plurality of light emitting units 3 correspondingly located at the plurality of openings 20, respectively; at least some light emitting units 3 adjacent to each other have different colors; each light emitting unit 3 includes an anode 30, a cathode 32, and a luminescent functional layer 31 between the anode 30 and the cathode 32; the anode 30, the luminescent functional layers 31, and the cathode 32 are sequentially stacked away from the base substrate 1; the luminescent functional layer 31 includes a first sub-layer 310, an orthographic projection of the first sub-layer 310 on the base substrate 1 partially overlaps an orthographic projection of a non-opening region 21 of the pixel defining layer 2 on the base substrate 1; and the first sub-layer 310 extends to a side of the non-opening region 21 of the pixel defining layer 2 away from the base substrate 1; the carrier mobility of the first sub-layers 310 of two adjacent ones of the at least some light emitting units 3 with different colors are different and orthographic projections of the first sub-layers 310 of two adjacent ones of the at least some light emitting units 3 with different colors on the base substrate 1 do not overlap each other.

The light emitting unit 3 is an OLED (organic light emitting diode) light emitting device, i.e., an organic electroluminescent device. The light emitting unit 3 emits light by injection and recombination of carriers, and the light emission intensity thereof is directly proportional to the intensity of the injected current. Under the electric field for the light emitting unit 3, holes generated by the anode 30 and electrons generated by the cathode 32 move, and migrate to the luminescent functional layer 31, respectively; when the holes and the electrons meet in the luminescent functional layer 31, energized excitons are generated, and undergo radiative transition, thereby producing visible light.

The light emitting units 3 with different colors emit visible light with different colors to realize color display of the display substrate. A pixel circuit is provided in the base substrate 1, and may be a driving circuit including thin film transistors, such as 7T1C, 9T1C, etc., and provides a driving current to the anode 30 of each light emitting unit 3 to drive the light emitting unit 3 to emit light. The pixel defining layer 2 is configured to define where the light emitting units 3 are arranged. The pixel defining layer 2 may be made of an organic resin material.

In some embodiments, the first sub-layers 310 of two adjacent light emitting units 3 with different colors are located on the same horizontal reference plane; the first sub-layers 310 of two adjacent light emitting units 3 with different colors have different carrier mobility; the orthographic projections of the first sub-layers 310 of two adjacent light emitting units 3 with different colors on the base substrate 1 do not overlap each other. Compared with the structure of the OLED display panel in FIG. 3 and FIG. 4 in the related art, the first sub-layers 310 of two adjacent light emitting units 3 with different colors are discontinuously spaced from each other, so that when lighting the light emitting unit 3 having one of the colors and with the first sub-layer 310 of a higher carrier mobility independently, the first sub-layer 310 of the light emitting unit 3 will not transport holes to the adjacent light emitting unit 3 having another color and with the first sub-layer 310 of a lower carrier mobility, thereby eliminating or avoiding false lighting of the light emitting unit 3 having another color and with the first sub-layers 310 of a lower carrier mobility and further, eliminating or avoiding the problem of the chromaticity shift of the monochrome picture occurring when the display substrate displays the monochrome picture, such that the color accuracy of the monochrome picture is better.

In some embodiments, referring to FIG. 7, the luminescent functional layer 31 further includes a second sub-layer 311; the first sub-layer 310 and the second sub-layer 311 are sequentially stacked away from the anode 30; an orthographic projection of the second sub-layer 311 of the light emitting unit 3 on the base substrate 1 at least partially overlaps with an orthographic projection of the non-opening region 21 of the pixel defining layer 2 on the base substrate 1, and the second sub-layer 311 extends to the side of the non-opening region 21 of the pixel defining layer 2 away from the base substrate 1; orthographic projections of the second sub-layers 311 of two adjacent ones of the at least some light emitting units 3 with different colors on the base substrate 1 do not overlap each other. Compared with the structures of the OLED display panels in FIG. 3 and FIG. 4 in the related art, the second sub-layers 311 of two adjacent light emitting units 3 with different colors are discontinuously spaced from each other in the present disclosure. In this way, when lighting the light emitting unit 3 having one of the colors and with a first sub-layer 310 of a higher carrier mobility independently, the false lighting of an adjacent light emitting unit 3 having another color and with a first sub-layers 310 of a lower carrier mobility caused by transmission of holes by the second sub-layers 311 between the two adjacent light emitting units 3 is eliminated or avoided, and further, the problem of the chromaticity shift of the monochrome picture occurring when the display substrate displays the monochrome picture is eliminated or avoided, so that the color accuracy of the monochrome picture is better.

In this embodiment, the first sub-layer 310 is a luminescent auxiliary layer of the light emitting unit 3, and the second sub-layer 311 is an exciton generation-radiative transition layer of the light emitting unit 3; the first sub-layer 310 facilitates transmission of the holes; energized excitons are generated in the second sub-layer 311, and undergo radiative transition, thereby producing visible light. The first sub-layer 310 and the second sub-layer 311 are sequentially stacked away from the anode 30, to form a luminescent layer of the light emitting unit 3.

In some embodiments, referring to FIG. 7, in at least some light emitting units 3, orthographic projections of the first sub-layer 310 and the second sub-layer 311 on the base substrate 1 are coincide with each other.

Figure 8:
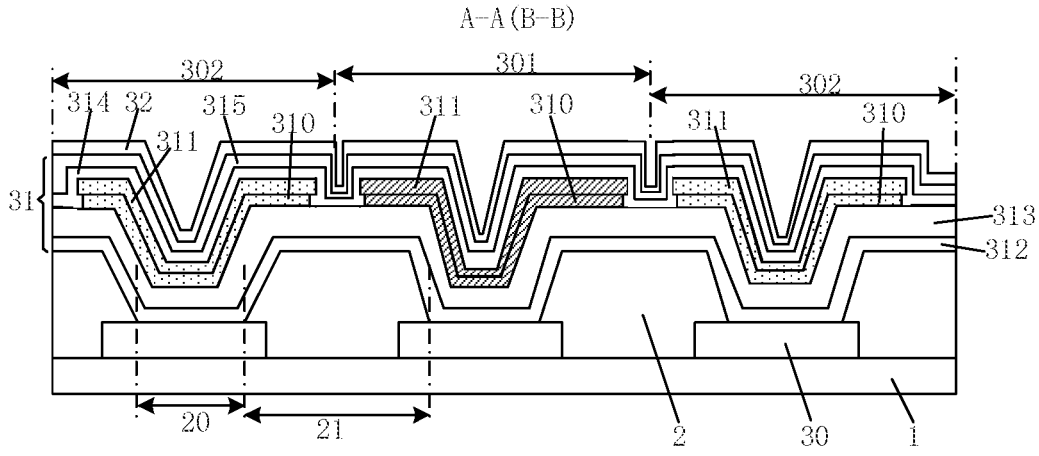
FIG. 8 is a schematic cross-sectional view of another structure showing a display substrate along a cutting line AA in FIG. 5 and a cutting line BB in FIG. 6.

In some embodiments, referring to FIG. 8, the orthographic projection of the first sub-layer 310 on the base substrate 1 falls within the orthographic projection of the second sub-layer 311 on the base substrate 1, and an area of the orthographic projection of the first sub-layer 310 on the base substrate 1 is smaller than an area of the orthographic projection of the second sub-layer 311 on the base substrate 1.

Figure 9:
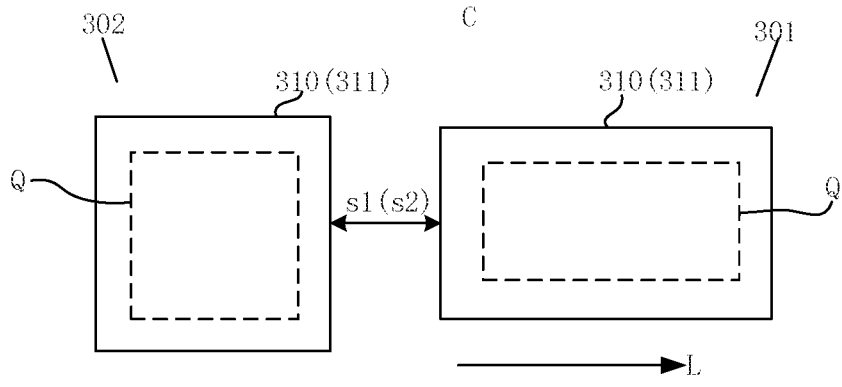
FIG. 9 is a schematic top view of a portion C in FIG. 5.

In some embodiments, referring to FIG. 9, a closest distance s1 between adjacent boundaries of the first sub-layers 310 of two adjacent ones of the at least some light emitting units 3 with different colors is in a range of 1 μm to 5 μm. The closest distance s1 between the adjacent boundaries of the first sub-layers 310 of the two adjacent ones of the at least some light emitting units 3 with different colors is formed by retracting the first sub-layers 310 of two adjacent ones of the at least some light emitting units 3 with different colors inward in a direction L where the two adjacent light emitting units 3 with different colors are arranged.

In some embodiments, referring to FIG. 9. a closest distance s2 between adjacent boundaries of the second sub-layers 311 of two adjacent ones of the at least some light emitting units 3 with different colors is in a range of 1 μm to 5 μm. The closest distance s2 between the adjacent boundaries of the second sub-layers 311 of the two adjacent ones of the at least some light emitting units 3 with different colors is formed by retracting the second sub-layers 311 of two adjacent ones of the at least some light emitting units 3 with different colors inward in the direction L where the two adjacent light emitting units 3 with different colors are arranged.

Figure 10:
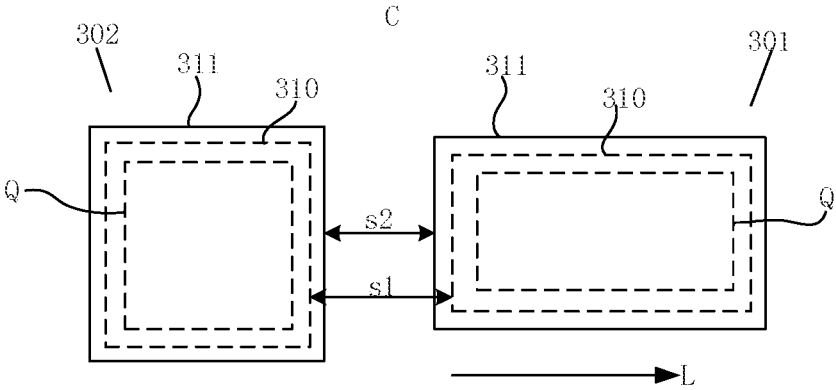
FIG. 10 is another schematic top view of portion C of FIG. 5.

In some embodiments, referring to FIG. 10, the closest distance s2 between adjacent boundaries of the second sub-layers 311 of two adjacent ones of the at least some light emitting units 3 with different colors is in a range of 1.5 μm to 4.5 μm. In this case, the second sub-layer 311 of the light emitting unit 3 may cover a part of an end surface or the entire end surface of the first sub-layer 310. Alternatively, the second sub-layer 311 of the light emitting unit 3 may not cover the end surface of the first sub-layer 310.

Figure 11:
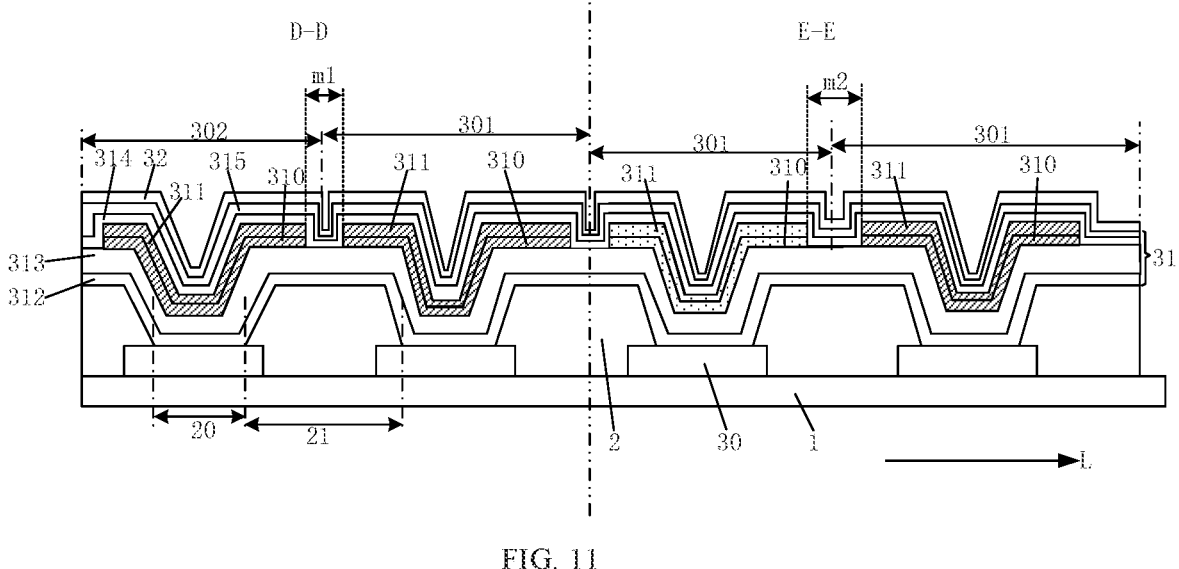
FIG. 11 is a schematic diagram showing a comparison between structures of a display substrate along a cutting line DD and a cutting line EE in FIG. 6.

In some embodiments, referring to FIGS. 6 and 11, at least some adjacent light emitting units 3 have the same color; a nearest first distance m1 between adjacent boundaries of openings 20 where two adjacent light emitting units 3 having the same color are located is smaller than a nearest second distance m2 between adjacent boundaries of openings 20 where two adjacent light emitting units 3 having different colors are located; a difference between the second distance m2 and the first distance mil is in a range of 0.5 μm to 2.5 μm. The first sub-layers 310 and the second sub-layers 311 of two adjacent light emitting units 3 with different colors each are retracted inward by a certain size in the direction L where the two adjacent light emitting units 3 with different colors are arranged, so that a size, of each of parts of the first sub-layers 310 and the second sub-layers 311 of the two adjacent light emitting units 3 with different colors lapping on the side the non-opening region 21 of the pixel defining layer 2 away from the base substrate 1, is reduced. The second distance m2 is set to be greater than the first distance m1 (generally, a nearest distance between adjacent boundaries of any two adjacent openings 20 is set to be the first distance m1) by a certain size, that is, a size of each of the openings 20 corresponding to the two adjacent light emitting units 3 with different colors is reduced (that is, the opening 20 is retracted inward), and accordingly, a. distance between the openings 20 corresponding to the two adjacent light emitting units 3 with different colors is increased, so that it may be ensured that a manufacturing defect does not occur that the first sub-layers 310 and the second sub-layers 311 of the light emitting units 3 are not evaporated on edges of corresponding openings 20 after the first sub-layers 310 and the second sub-layers 311 are retracted inward with the same process conditions and with the same process difficulty, which ensures the quality of the display substrate.

In some embodiments, the closest distance between adjacent boundaries of the first sub-layers 310 of two adjacent ones of at least some light emitting units 3 with different colors is twice a size of retraction for openings 20 corresponding to the two adjacent light emitting units 3 with different colors. That is, in a case where the first sub-layers 310 of the light emitting units 3 are retracted by x, the size of retraction for the openings 20 corresponding to the light emitting units 3 is x/2, so that it may be ensured that the manufacturing defect does not occur that the first sub-layers 310 and the second sub-layers 311 of the light emitting units 3 are not evaporated on edges of corresponding openings 20 after the first sub-layers 310 and the second sub-layers 311 are retracted inward with the same process conditions and with the same process difficulty.

In some embodiments, whether the openings 20 corresponding to two adjacent light emitting units 3 having different colors are retracted inward or not and the specific retraction size, may be selectively determined according to the life of the light emitting units 3 having different colors and edge defects in the evaporation process.

In this embodiment, the nearest second distance m2 between the adjacent boundaries of the openings 20, where two adjacent ones of the at least some light emitting units 3 with different colors are located, is increased from the original 17.3 μm to 18.3 μm. That is, a size of the openings 20 corresponding to two adjacent light emitting units 3 with different colors is retracted inward by 1 μm.

In some embodiments, in the two adjacent ones of the at least some light emitting units 3 with different colors, a carrier mobility of the first sub-layer 310 of the first light emitting unit 301 is higher than that of the first sub-layer 310 of the second light emitting unit 302. The first light emitting unit 301 includes a green light emitting unit, and the second light emitting unit 302 includes a red light emitting unit.

Figure 12:
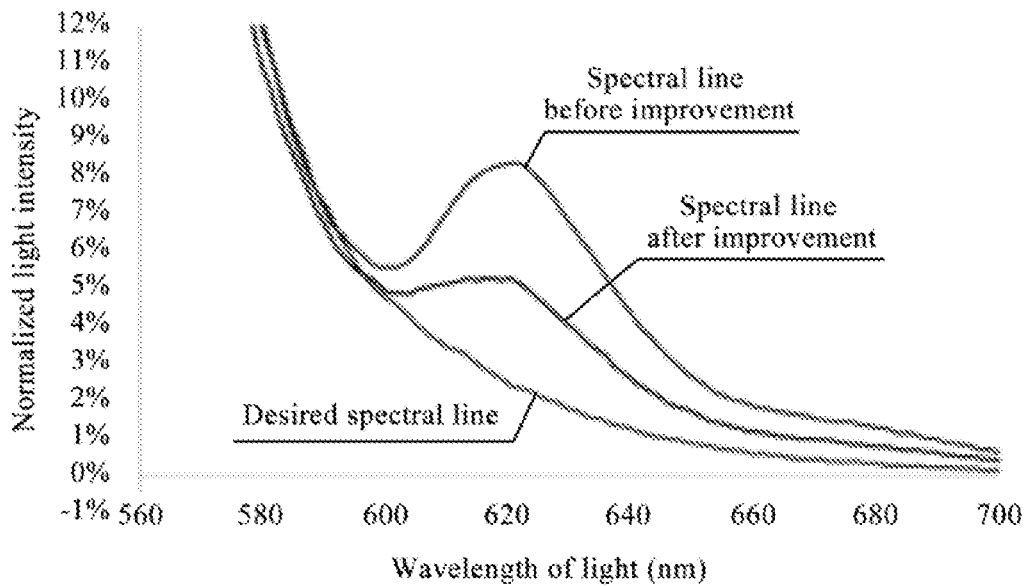
FIG. 12 is a schematic diagram showing a curve of an improvement of a display substrate of FIG. 7 for the color shift of monochrome display.

In this embodiment, referring to FIG. 12, by using the display substrate in FIG. 7, that is, the adjacent boundaries of the first sub-layers 310 of the green light emitting unit 3 and the red light emitting unit 3 adjacent to each other are separated from each other by a certain distance, it is found from the spectrum when the green picture is displayed on the display substrate that the color mixing interference of the red light emitting unit 3 to the green light emitting unit 3 is reduced from the original 8.4% to 5.3%. The red color mixing interference when the green picture is displayed on the display substrate is significantly eliminated, and a final test result for a display module adopting the display substrate shows that with the solution of the display substrate in FIG. 7, the color accuracy of displaying the pure green picture on the display substrate is improved by 37.53%.

In some embodiments, referring to FIGS. 9 and 10, each light emitting unit 3 includes an effective light emitting area Q, which is defined by the opening 20 in the pixel defining layer 2; an orthographic projection of the effective light emitting area Q of at least one of the first light emitting unit 301 and the second light emitting unit 302 on the base substrate 1 is of a rectangle or a rounded rectangle, which satisfies at least one of: a size of the effective light emitting area Q of the first light emitting unit 301 in a range of 14.9 μm×9.4 μm to 30.9 μm×24.62 μm a size of the effective light emitting area Q of the second light emitting unit 302 in a range of 12.8 μm×12.8 μm to 28.5 μm×28.5 μm. The size of the effective light emitting area Q of the light emitting unit 3 is slightly reduced after the opening 20 of the pixel defining layer 2 is retracted inward, or remains unchanged under certain conditions for the manufacturing process.

In some embodiments, the size of the effective light emitting area Q of the first light emitting unit 301 is in a range of 19.9 μm×14.4 μm to 22.9 μm 16.62 μm; the size of the effective light emitting area Q of the second light emitting unit 302 is in a range of 17.8 μm×17.8 μm to 20.5 μm×20.5 μm.

In some embodiments, the size of the effective light emitting area Q of the first light emitting unit 301 is in a range of 14.9 μm×9.4 μm to 17.9 μm×11.62 μm; the size of the effective light emitting area Q of the second light emitting unit 302 is in a range of 12.8 μm×12.8 μm to 15.5 μm×15.5 μm.

In some embodiments, the size of the effective light emitting area Q of the first light emitting unit 301 is in a range of 27.9 μm×22.4 μm to 30.9 μm×24.62 μm; the size of the effective light emitting area Q of the second light emitting unit 302 is in a range of 25.8 μm×25.8 μm to 28.5 μm×28.5 μm.

The size of the effective light emitting area Q is a minimum size of the retracted opening 20 of the pixel defining layer 2 where the light emitting unit 3 is located, and the minimum size of the opening is usually a size of a bottom of the opening 20. A cross-sectional shape of each opening 20 in the pixel defining layer 2, formed by using the conventional patterning process (including a film formation, an exposure, a development, an etching, and the like), and perpendicular to a plane where the pixel defining layer 2 is located, is generally an inverted trapezoid. Only layers on the anode 30 in the effective light emitting area Q are in direct contact with the anode 30, so that the holes generated by the anode 30 under the electric field are generally transported only in the effective light emitting area Q, and the second sub-layer 311 of each light emitting unit 3 generally emits light only in an area corresponding to the effective light emitting area Q.

In some embodiments, the resolution of the display substrate corresponding to the minimum sizes of the effective light emitting areas Q of the first light emitting unit 301 and the second light emitting unit 302 is 2376×1080; the resolution of the display substrate corresponding to the maximum sizes of the effective light emitting areas Q of the first light emitting unit 301 and the second light emitting unit 302 is 3216×1440.

Figure 13:
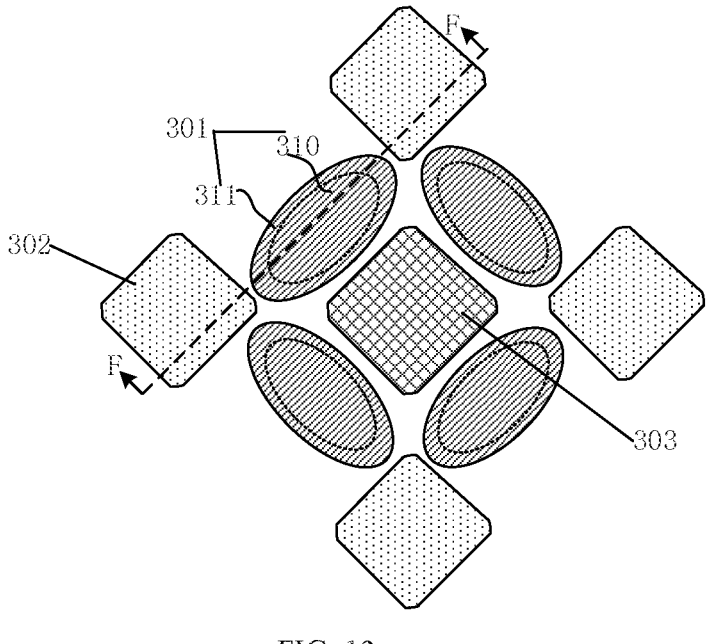
FIG. 13 is a schematic top view of another arrangement of light emitting units in a display substrate according to an embodiment of the present disclosure.
Figure 14:
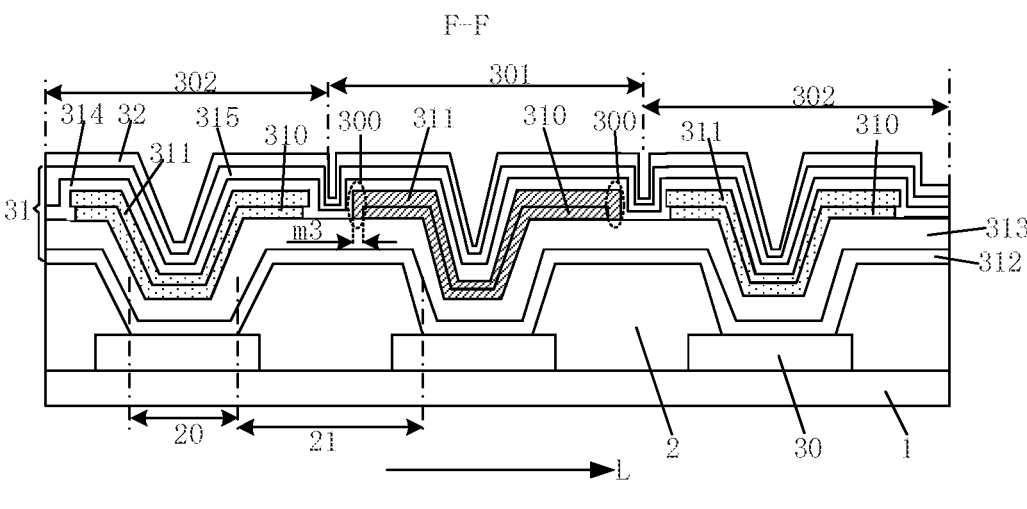
FIG. 14 is a schematic cross-sectional view of a structure showing a display substrate along a cutting line FF in FIG. 13.

In some embodiments, referring to FIGS. 13 and 14, the second sub-layer 311 of each light emitting unit 3 extends to the side of the non-opening region 21 of the pixel defining layer 2 away from the base substrate 1; in two adjacent ones of the at least some light emitting units 3 with different colors, the carrier mobility of the first sub-layer 310 of the first light emitting unit 301 is higher than that of the first sub-layer 310 of the second light emitting unit 302; the carrier mobility of the second sub-layer 311 of the first light emitting unit 301 is lower than that of the first sub-layer 310 of the second light emitting unit 302; the second sub-layer 311 of the first light emitting unit 301 further extends to at least a partial area between the first sub-layer 310 of the second light emitting unit 302 and the first sub-layer 310 of the first light emitting unit 301, thereby forming an extension portion 300.

In some embodiments, the first sub-layers 310 of two adjacent light emitting units 3 with different colors are located on the same horizontal reference plane; the second sub-layer 311 of the first light emitting unit 301 extends to a position between adjacent boundaries of the first sub-layer 310 of the second light emitting unit 302 and the first sub-layer 310 of the first light emitting unit 301.

The carrier mobility of the second sub-layer 311 of the first light emitting unit 301 is lower than that of the first sub-layer 310 of the second light emitting unit 302, that is, an energy level of the second sub-layer 311 of the first light emitting unit 301 is higher than that of the first sub-layer 310 of the second light emitting unit 302. In the case where the same horizontal reference plane, where the first sub-layers 310 of two adjacent light emitting units 3 with different colors are located, has a constant energy level, an energy level difference between the horizontal reference plane and the second sub-layer 311 of the first light emitting unit 301 is greater than that between the horizontal reference plane and the first sub-layer 310 of the second light emitting unit 302, so that it is difficult for holes transmitted from the anode 30 of the first light emitting unit 301 to the horizontal reference plane, to penetrate through the second sub-layer 311 of the first light emitting unit 301 to the first sub-layer 310 and even the second sub-layer 311 of the second light emitting unit 302, when lighting the first light emitting unit 301 independently, thereby eliminating or avoiding the false lighting of the second light emitting unit 302.

In some embodiments, referring to FIGS. 13 and 14, the extension portion 300 is correspondingly located in the non-opening region 21 of the pixel defining layer 2; an orthographic projection of the first sub-layer 310 of the second light emitting unit 302 on the base substrate 1 does not overlap an orthographic projection of the extension portion 300 on the base substrate 1.

Figure 15:
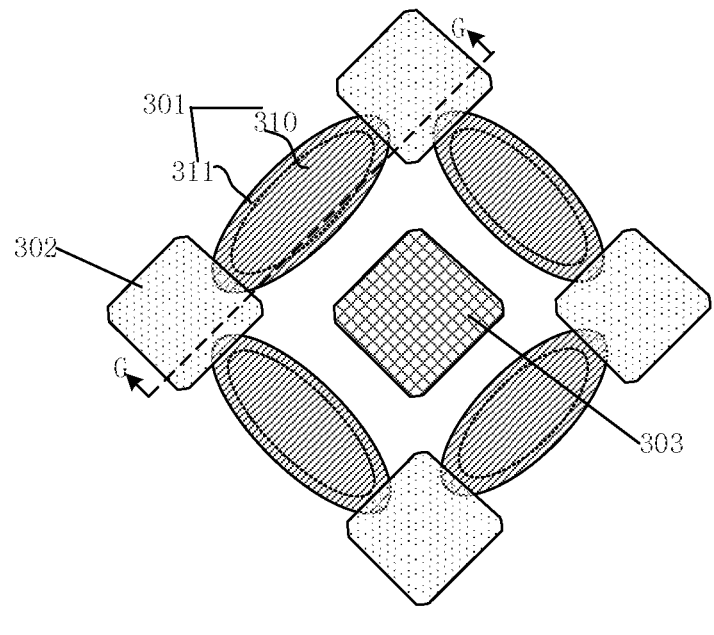
FIG. 15 is a schematic top view of another arrangement of light emitting units in a display substrate according to an embodiment of the present disclosure.
Figure 16:
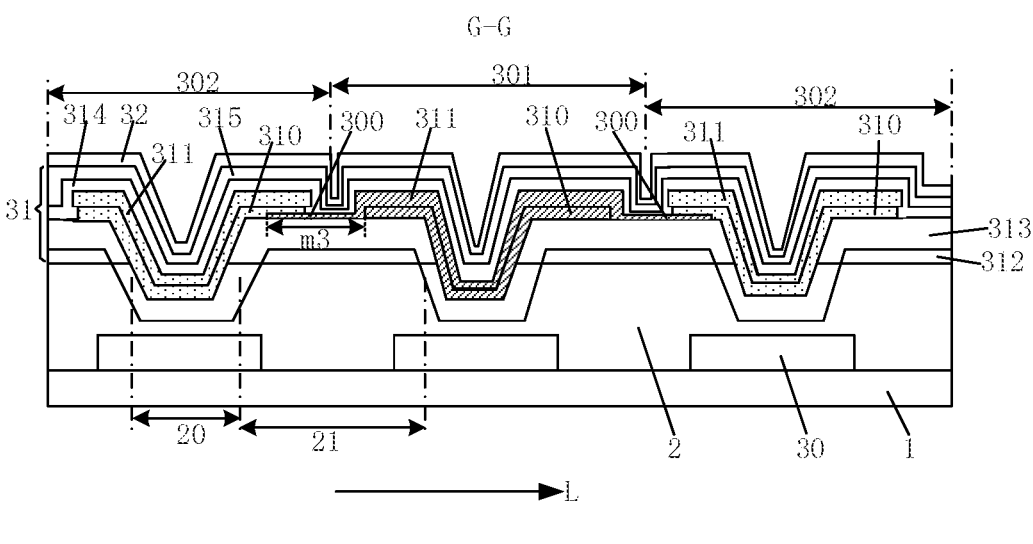
FIG. 16 is a schematic cross-sectional view of a structure showing a display substrate along a cutting line GG in FIG. 15.

In some embodiments, referring to FIGS. 15 and 16, the extension portion 300 is correspondingly located in the non-opening region 21 of the pixel defining layer 2; the extension portion 300 further extends to a position between the first sub-layer 310 of the second light emitting unit 302 and the pixel defining layer 2; the orthographic projection of the first sub-layer 310 of the second light emitting unit 302 on the base substrate 1 partially overlaps the orthographic projection of the extension portion 300 on the base substrate 1. The extension portion 300 further extends to a position below the first sub-layer 310 of the second light emitting unit 302 (i.e. a side of the first sub-layer 310 close to the pixel defining layer 2), so that when lighting the first light emitting unit 301 independently, holes transmitted from the anode 30 of the first light emitting unit 301 to the horizontal reference plane may be further prevented from passing through the second sub-layer 311 of the first light emitting unit 301 to the first sub-layer 310 and even the second sub-layer 311 of the second light emitting unit 302, thereby further eliminating or avoiding the false lighting of the second light emitting unit 302.

In some embodiments, referring to FIGS. 15 and 16. an orthographic projection of the second sub-layer 311 of the second light emitting unit 302 on the base substrate 1 partially overlaps the orthographic projection of the extension portion 300 on the base substrate 1.

In some embodiments, referring to FIGS. 14 and 16, a size m3 of the extension portion 300 along the direction L where two adjacent light emitting units 3 with different colors are arranged is in a range of 2 μm to 5 μm. Referring to FIG. 14, the extension portion 300 may be a portion located between adjacent boundaries of the first sub-layer 310 of the second light emitting unit 302 and the first sub-layer 310 of the first light emitting unit 301. Referring to FIG. 16, the extension portion 300 may alternatively be a portion of the second sub-layer 311 of the first light emitting unit 301 extending to a position between adjacent boundaries of the first sub-layer 310 of the second light emitting unit 302 and the first sub-layer 310 of the first light emitting unit 301, and a portion extending to a position between the first sub-layer 310 of the second light emitting unit 302 and the non-opening region 21 of the pixel defining layer 2 and located within the orthographic projection of the first sub-layer 310 of the second light emitting unit 302 on the base substrate 1.

In some embodiments, the first light emitting unit 301 includes a green light emitting unit; the second light emitting unit 302 includes a red light emitting unit. That is, excitons undergo radiative transition in the luminescent layer of the first light emitting unit 301, thereby emitting green light; and excitons undergo radiative transition in the luminescent layer of the second light emitting unit 302, thereby emitting red light. The visual effect of the phenomenon of the chromaticity shift is more obvious when the display substrate displays a low gray scale green picture, so that the improved solution of the display substrate in this embodiment is mainly suitable for the green light emitting unit 3 and the red light emitting unit 3 adjacent to each other. Alternatively, in the development of the technology, for the case that the phenomenon of the chromaticity shift when displaying the monochrome picture exists between any two adjacent light emitting units 3 with different colors in the display substrate, the technical solution in this embodiment may eliminate or avoid the phenomenon of chromaticity shift.

In this embodiment, by using the display substrate in FIGS. 13 to 16, that is, the second sub-layer 311 of the first light emitting unit 301 extends to a position between the first sub-layer 310 of the second light emitting unit 302 and the first sub-layer 310 of the first light emitting unit 301, and the extension portion 300 is formed, a simulation result when the display substrate displays a green picture shows that the red color mixing interference when the display substrate displays a green picture is significantly eliminated, and the final test result of the display module using the display substrate shows that in this embodiment, with the display substrate in each of FIGS. 13 to 16, the color accuracy of displaying the pure green picture on the display substrate is further improved by 25%.

Figure 17:
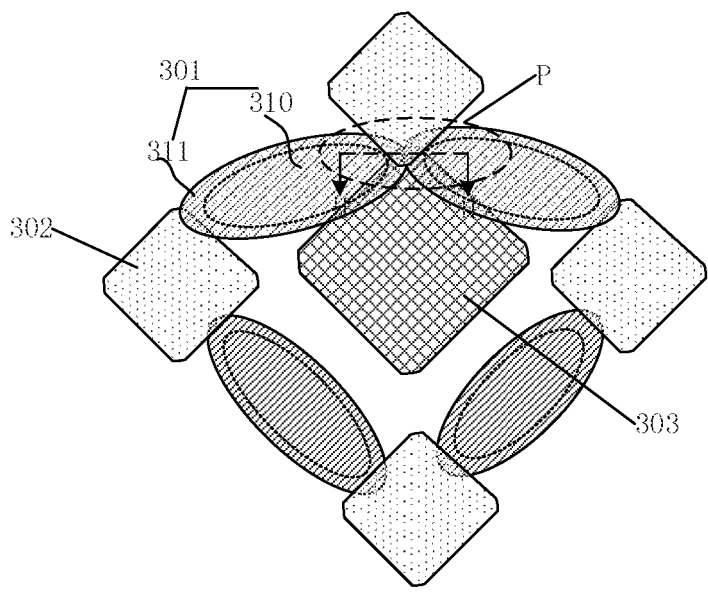
FIG. 17 is a schematic top view of another arrangement of light emitting units in a display substrate according to an embodiment of the present disclosure.
Figure 18:
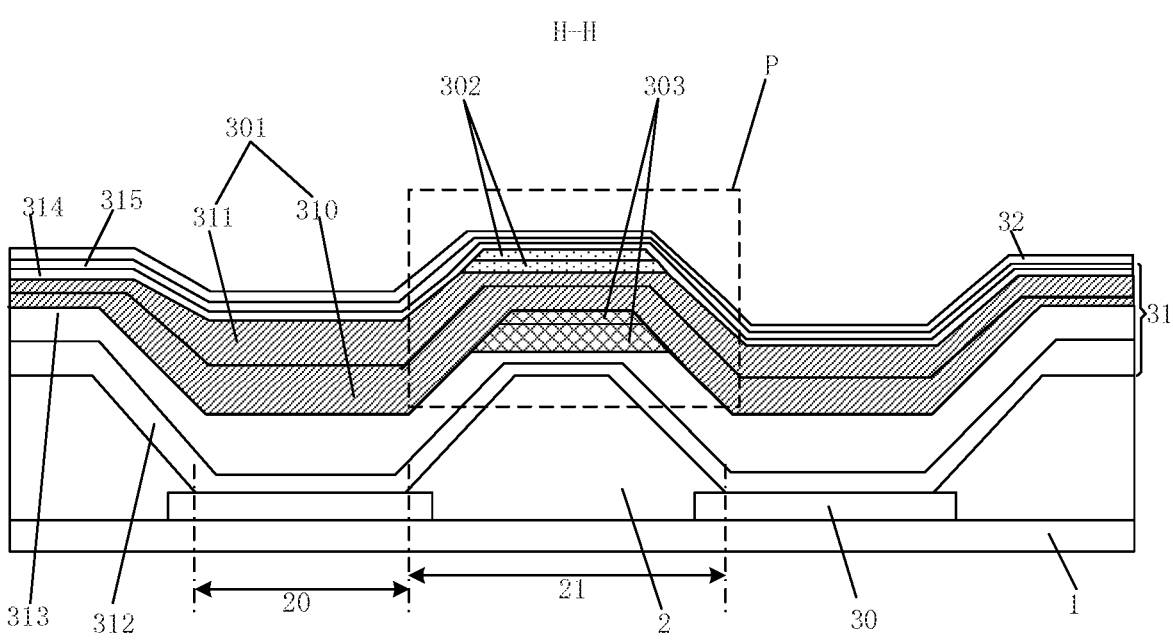
FIG. 18 is a schematic cross-sectional view of a structure showing a display substrate along a cutting line HH in FIG. 17.

In some embodiments, referring to FIGS. 17 and 18, the display substrate further includes a blue light emitting unit 303; any two of the blue light emitting unit 303, the first light emitting unit 301 and the second light emitting unit 302 are adjacent to each other, and the blue light emitting unit 303, the first light emitting unit 301 and the second light emitting unit 302 are adjacent to each other and connected to each other at a position P on the side of the non-opening region 21 of the pixel defining layer 2 away from the base substrate 1. At the position P where the blue light emitting unit 303, the first light emitting unit 301 and the second light emitting unit 302 are adjacent to each other and connected to each other, the first sub-layer 310 and the second sub-layer 311 of the blue light emitting unit 303 are sequentially stacked away from the pixel defining layer 2: the first sub-layer 310 and the second sub-layer 311 of the first light emitting unit 301 are sequentially stacked away from the pixel defining layer 2; the first sub-layer 310 and the second sub-layer 311 of the second light emitting unit 302 are sequentially stacked away from the pixel defining layer 2; the first sub-layer 310 of the blue light emitting unit 303, the first sub-layer 310 of the first light emitting unit 301, and the first sub-layer 310 of the second light emitting unit 302 are sequentially stacked away from the pixel defining layer 2.

The carrier mobility of each of the first sub-layer 310 and the second sub-layer 311 of the blue light emitting unit 303 is much lower than that of each of the first sub-layer 310 and the second sub-layer 311 of the first light emitting unit 301 and that of each of the first sub-layer 310 and the second sub-layer 311 of the second light emitting unit 302, so that holes generated by the anode 30 in the blue light emitting unit 303 do not substantially penetrate through the first sub-layer 310 and the second sub-layer 311 of the blue light emitting unit 303 to the first sub-layer 310 and the second sub-layer 311 of the first light emitting unit 301 and the first sub-layer 310 and the second sub-layer 311 of the second light emitting unit 302. That is, the problem of the chromaticity shift does not occur when the display substrate displays the blue color picture. Thus, at the position P where the blue light emitting unit 303, the first light emitting unit 301 and the second light emitting unit 302 are adjacent to each other and connected to each other. the first sub-layer 310 and the second sub-layer 311 of the blue light emitting unit 303 are disposed at a bottom layer closest to the pixel defining layer 2; meanwhile, the second sub-layer 311 of the first light emitting unit 301 is interposed between the first sub-layer 310 of the first light emitting unit 301 and the first sub-layer 310 of the second light emitting unit 302, so that it is difficult for holes generated by the anode 30 of the first light emitting unit 301 to penetrate through the second sub-layer 311 of the first light emitting unit 301 to the first sub-layer 310 and even the second sub-layer 311 of the second light emitting unit 302, thereby eliminating or avoiding the false lighting of the second light emitting unit 302.

In some embodiments, a size of the effective light emitting area of the blue light emitting unit 303 is in a range of 18.2 μm 18.2 μm to 34.8 μm×34.8 μm. The resolution of the display substrate corresponding to the minimum size of the effective light emitting area of the blue light emitting unit 303 is 2376×1080; the resolution of the display substrate corresponding to the maximum size of the effective light emitting area of the blue light emitting unit 303 is 3216× 1440. The first sub-layer 310 of the blue light emitting unit 303 may not be necessarily retracted inward, so that the opening 20 in the pixel defining layer 2 corresponding to the blue light emitting unit 303 may not be retracted inward, and the size of the effective light emitting area of the blue light emitting unit 303 is not reduced.

In some embodiments, a size of the effective light emitting area of the blue light emitting unit 303 is in a range of 23.2 μm×23.2 μm to 26.8 μm×26.8 μm. In some embodiments, the size of the effective light emitting area of the blue light emitting unit 303 is in a range of 18.2 μm×18.2 μm to 21.8 μm×217.8 μm. In some embodiments. the size of the effective light emitting area of the blue light emitting unit 303 is in a range of 31.2 μm×31.2 μm to 34.8 μm 34.8 μm.

Figure 19:
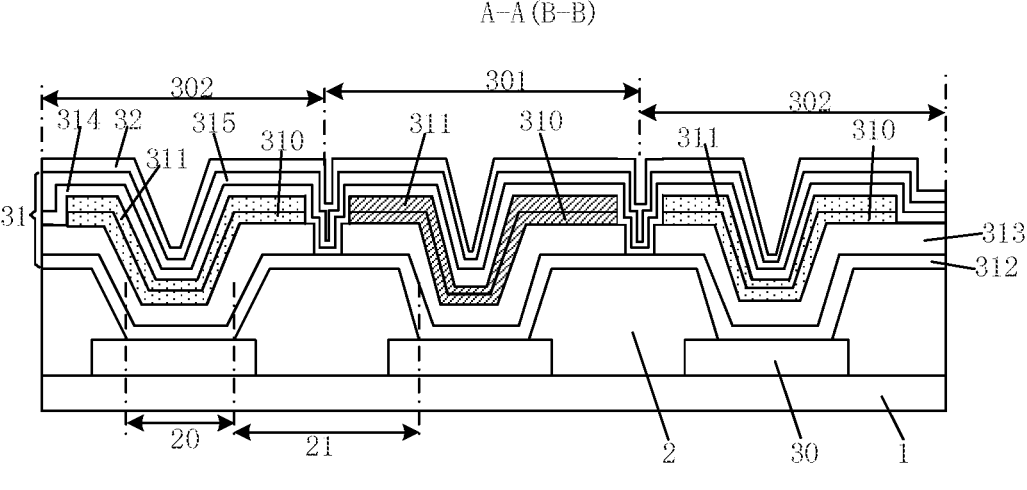
FIG. 19 is a schematic cross-sectional view of another structure showing a display substrate along a cutting line AA in FIG. 5 and a cutting line BB in FIG. 6.

In some embodiments, referring to FIGS. 7, 16, and 19, the luminescent functional layer 31 further includes a hole injection layer 312, a hole transport layer 313. an electron transport layer 314, and an electron injection layer 315; each of these layers is at least partially on the side of the non-opening region of the pixel defining layer 2 away from the base substrate 1; the hole injection layer 312, the hole transport layer 313, the first sub-layer 310, the second sub-layer 311, the electron transport layer 314, and the electron injection layer 315 are sequentially stacked away from the anode 30: the second sub-layer 311 is an exciton generation-radiative transition layer: the first sub-layer 310 is a luminescent auxiliary layer. The hole injection layer 312 and the hole transport layer 313 are used for transporting holes generated by the anode 30 under an electric field to the first sub-layer 310 and the second sub-layer 311; the electron transport layer 314 and the electron injection layer 315 are used for transporting electrons generated by the cathode 32 under the electric field to the second sub-layer 311.

In some embodiments, referring to FIG. 19, the hole transport layer 313 extends to the side of the non-opening region 21 of the pixel defining layer 2 away from the base substrate 1; carrier mobility of the hole transport layers 313 of two adjacent ones of the at least some light emitting units 3 of different colors are different; and orthographic projections of the hole transport layers 313 of two adjacent ones of the at least some light emitting units 3 with different colors on the base substrate 1 do not overlap each other.

In some embodiments, referring to FIG. 19, the hole transport layers 313 of two adjacent light emitting units 3 with different colors are located on the same horizontal reference plane; carrier mobility of the hole transport layers 313 of two adjacent light emitting units 3 with different colors are different; orthographic projections of the hole transport layers 313 of two adjacent light emitting units 3 with different colors on the base substrate 1 do not overlap each other. Compared with the structure of each of the OLED display panels in FIG. 3 and FIG. 4 in the prior art, the hole transport layers 313 of two adjacent light emitting units 3 with different colors are discontinuously spaced from each other in the present disclosure, so that when lighting the light emitting unit 3 having one of the colors and with the hole transport layers 313 of a higher carrier mobility independently, the hole transport layer 313 of the light emitting unit 3 do not transport holes to the hole transport layer 313 of the adjacent light emitting unit 3 having another color and with the hole transport layer 313 of a lower carrier mobility, thereby eliminating or avoiding the false lighting of the light emitting units 3 having another color and with the hole transport layer 313 of the lower carrier mobility and further, eliminating or avoiding the problem of the chromaticity shift of the monochrome picture occurring when the display substrate displays the monochrome picture, so that the color accuracy of the monochrome picture is better.

In some embodiments, referring to FIGS. 7 and 16, the hole transport layers 313 of the plurality of light emitting units 3 extend toward the side of the non-opening region 21 of the pixel defining layer 2 away from the base substrate 1 and are integrally connected to each other. A color crosstalk between the adjacent light emitting units 3 with different colors due to false transmission of holes is mainly caused by falsely transmitting holes by the first sub-layers 310 of the two adjacent light emitting units 3, and the amount of holes falsely transmitted between the hole transport layers 313 of the two adjacent light emitting units 3 with different colors and different carrier mobility is very small, so that the hole transport layers 313 of the plurality of light emitting units 3 may alternatively have a one-piece structure, which may reduce the complexity of the manufacturing process and the manufacturing cost for the display substrate.

In some embodiments, referring to FIGS. 7, 16 and 19, the hole injection layers 312 of the plurality of light emitting units 3 extend toward the side of the non-opening region 21 of the pixel defining layer 2 away from the base substrate 1 and are integrally connected to each other; and/or the electron transport layers 314 of the plurality of light emitting units 3 extend toward the side of the non-opening region 21 of the pixel defining layer 2 away from the base substrate 1 and are integrally connected to each other; and/or the electron injection layers 315 of the plurality of light emitting units 3 extend toward the side of the non-opening region 21 of the pixel defining layer 2 away from the base substrate 1 and are integrally connected to each other; and/or the cathodes 32 of the plurality of light emitting units 3 extend toward the side of the non-opening region 21 of the pixel defining layer 2 away from the base substrate 1 and are integrally connected to each other. That is, the hole injection layers 312, the electron transport layers 314 and the electron injection layers 315 of the plurality of light emitting units 3 may alternatively have a one-piece structure, respectively, which may reduce the complexity of the manufacturing process and the manufacturing cost for the display substrate.

Figure 20:
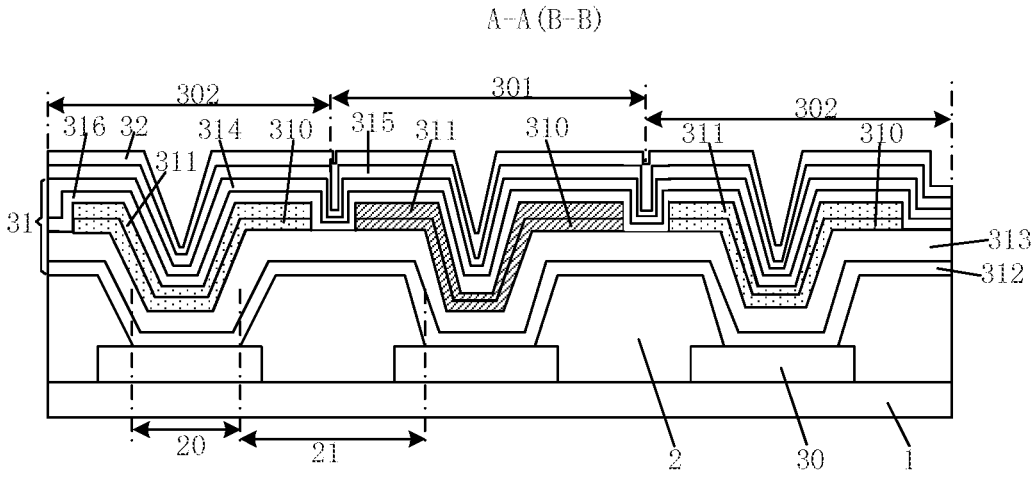
FIG. 20 is a schematic cross-sectional view of another structure showing a display substrate along a cutting line AA in FIG. 5 and a cutting line BB in FIG. 6.

In some embodiments, referring to FIG. 20, the luminescent functional layer 31 further includes a hole blocking layer 316 between the second sub-layer 311 and the electron transport layer 314; the hole blocking layers 316 of the plurality of light emitting units 3 extend toward the side of the non-opening region 21 of the pixel defining layer 2 away from the base substrate 1 and are integrally connected to each other. The hole blocking layer 316 may prevent holes from transmitting to the electron transport layer 314, improving the luminous efficiency of the light emitting unit 3.

Figure 21:
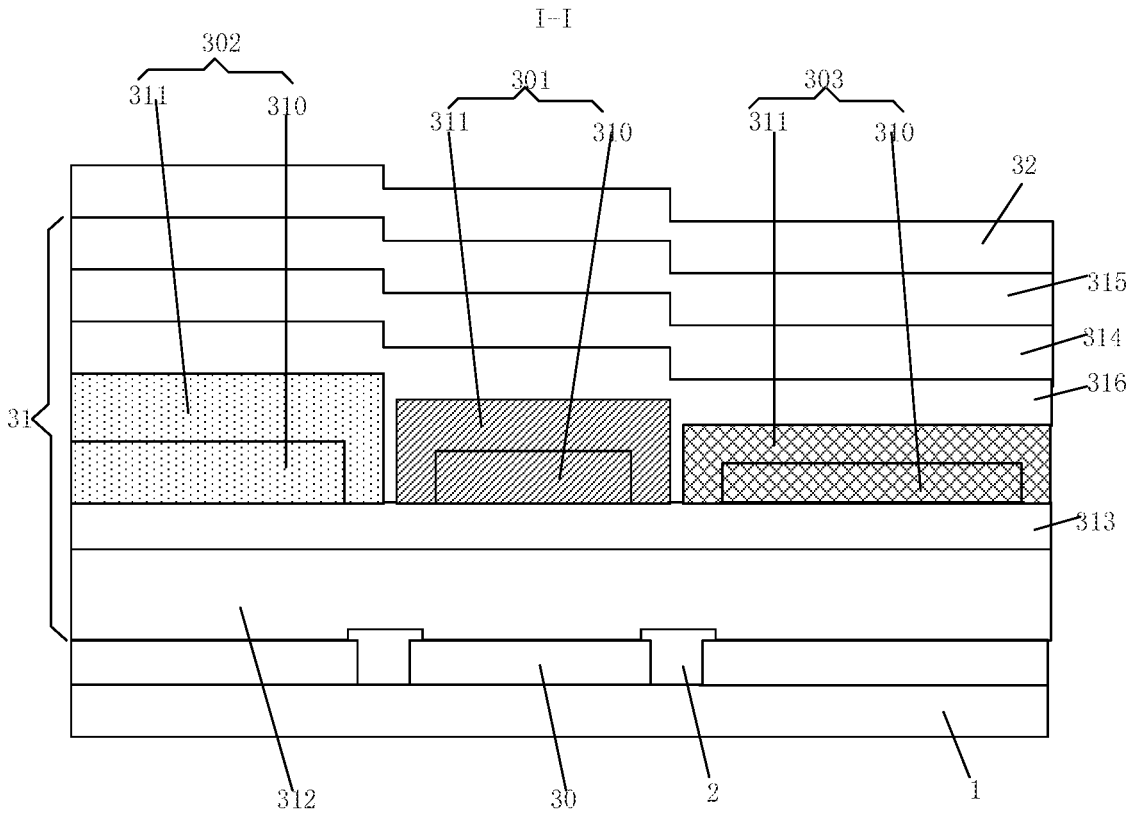
FIG. 21 is a schematic cross-sectional view of another structure showing a display substrate along a cutting line II in FIG. 5.

In some embodiments, referring to FIG. 21, a thickness of the first sub-layer 310 of the second light emitting unit 302 is greater than that of the first sub-layer 310 of the first light emitting unit 301; and/or, the thickness of the first sub-layer 310 of the first light emitting unit 301 is greater than that of the first sub-layer 310 of the blue light emitting unit 303; and/or, a thickness of the second sub-layer 311 of the second light emitting unit 302 is greater than that of the second sub-layer 311 of the first light emitting unit 301; and/or, the thickness of the second sub-layer 311 of the first light emitting unit 301 is greater than that of the second sub-layer 311 of the blue light emitting unit 303.

In some embodiments, thicknesses of the hole injection layer 312, the hole transport layer 313, the hole blocking layer 316, the electron transport layer 314, the electron injection layer 315, and the cathode 32 of each light emitting unit 3 are uniform on the non-opening region 21 of the pixel defining layer 2. Thicknesses of the hole injection layer 312, the hole transport layer 313, the hole blocking layer 316, the electron transport layer 314, the electron injection layer 315, and the cathode 32 of each light emitting unit 3 are uniform at the opening 20 of the pixel defining layer 2. The thicknesses of the hole injection layer 312, the hole transport layer 313, the hole blocking layer 316, the electron transport layer 314, the electron injection layer 315, and the cathode 32 of each light emitting unit 3 at the opening 20 and the non-opening region 21 of the pixel defining layer 2 may slightly fluctuate due to process variations, but a fluctuation in each thickness of each layer of these layers is not more than 10% the thickness of the layer.

The thickness of each layer in the luminescent functional layer 31 is set such that the light emitting units 3 having different colors have different resonant cavity lengths (the resonant cavity length is a distance between surfaces, which are opposite to each other, of the anode 30 and the cathode 32 of the light emitting unit 3), and the light emitted by each of the light emitting units 3 having different colors has the same resonance frequency as the inherent vibration number of the luminous substance, thereby improving the luminous efficiency and improving the optical characteristics or picture quality characteristics of the display substrate.

In some embodiments, the second light emitting unit 302 is a red light emitting unit and the first light emitting unit 301 is a green light emitting unit. As for the red light emitting unit, a thickness of the first sub-layer 310 is 800 angstroms, and a thickness of the second sub-layer 311 is 450 angstroms; as for the green light emitting unit, a thickness of the first sub-layer 310 is 400 angstroms, and a thickness of the second sub-layer 311 is 350 angstroms; as for the blue light emitting unit 303, the thickness of the first sub-layer 310 is 50 angstroms, and the thickness of the second sub-layer 311 is 200 angstroms.

In some embodiments, a thickness of the hole injection layer 312 is 100 angstroms; a thickness of the hole transport layer 313 is 1000 angstroms; a thickness of the hole blocking layer 316 is 50 angstroms; a thickness of the electron transport layer 314 is 300 angstroms; a thickness of the electron injection layer 315 is 100 angstroms; a thickness of the cathode 32 is 150 angstroms.

In some embodiments, the thicknesses of the hole injection layer 312, the hole transport layer 313, the hole blocking layer 316, the electron transport layer 314, the electron injection layer 315, and the cathode 32 may alternatively be non-uniform.

The embodiment of the present disclosure further provides a display panel, which includes the display substrate in the above embodiment.

The display panel provided by the embodiment of the present disclosure may be any product or component with a display function, such as an OLED panel, an OLED television, a display, a mobile phone, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made without departing from the spirit and scope of the present disclosure, and such changes and modifications also fall within the scope of the present disclosure.

What is claimed is:

1. A display substrate, comprising:

a base substrate;

a pixel defining layer on the base substrate, wherein the pixel defining layer comprises a plurality of openings therein distributed at intervals; and a plurality of light emitting units correspondingly located at the plurality of openings, respectively; wherein at least some adjacent light emitting units have different colors;

wherein each of the plurality of light emitting units comprises an anode, a cathode, and a luminescent functional layer between the anode and the cathode;

the luminescent functional layer comprises a first sub-layer, an orthographic projection of the first sub-layer on the base substrate partially overlaps an orthographic projection of a non-opening region of the pixel defining layer on the base substrate; and the first sub-layer extends to a side of the non-opening region of the pixel defining layer away from the base substrate; and wherein carrier mobilities of the first sub-layers of two adjacent ones of the at least some adjacent light emitting units with different colors are different, and orthographic projections of the first sub-layers of the two adjacent ones of the at least some adjacent light emitting units with different colors on the base substrate do not overlap each other;

wherein the luminescent functional layer further comprises a second sub-layer; the first sub-layer and the second sub-layer are sequentially stacked away from the anode; an orthographic projection of the second sub-layer of the light emitting unit on the base substrate at least partially overlaps with the orthographic projection of the non-opening region of the pixel defining layer on the base substrate, and the second sub-layer extends to the side of the non-opening region of the pixel defining layer away from the base substrate;

orthographic projections of the second sub-layers of the two adjacent ones of the at least some adjacent light emitting units with different colors on the base substrate do not overlap each other;

in the two adjacent ones of the at least some light emitting units with different colors, a carrier mobility of a first sub-layer of a first light emitting unit is higher than that of a first sub-layer of a second light emitting unit; a carrier mobility of a second sub-layer of the first light emitting unit is lower than that of the first sub-layer of the second light emitting unit; and wherein the first light emitting unit comprises a green light emitting unit; and the second light emitting unit comprises a red light emitting unit; and the display substrate further comprises a blue light emitting unit; wherein any two of the blue light emitting unit, the first light emitting unit and the second light emitting unit are adjacent to each other, and the blue light emitting unit, the first light emitting unit and the second light emitting unit are adjacent to each other and connected to each other at a position on the side of the non-opening region of the pixel defining layer away from the base substrate;

at the position where the blue light emitting unit, the first light emitting unit and the second light emitting unit are adjacent to each other and connected to each other, the first sub-layer and the second sub-layer of the blue light emitting unit are sequentially stacked away from the pixel defining layer; the first sub-layer and the second sub-layer of the first light emitting unit are sequentially stacked away from the pixel defining layer; the first sub-layer and the second sub-layer of the second light emitting unit are sequentially stacked away from the pixel defining layer; and the first sub-layer of the blue light emitting unit, the first sub-layer of the first light emitting unit, and the first sub-layer of the second light emitting unit are sequentially stacked away from the pixel defining layer.

2. The display substrate of claim 1, wherein in each of the at least some light emitting units, orthographic projections of the first sub-layer and the second sub-layer on the base substrate coincide with each other; or the orthographic projection of the first sub-layer on the base substrate falls within the orthographic projection of the second sub-layer on the base substrate, and an area of the orthographic projection of the first sub-layer on the base substrate is smaller than an area of the orthographic projection of the second sub-layer on the base substrate.

3. The display substrate of claim 1, wherein the second sub-layer of the first light emitting unit further extends to at least a partial area between the first sub-layer of the second light emitting unit and the first sub-layer of the first light emitting unit, thereby forming an extension portion.

4. The display substrate of claim 3, wherein the extension portion is correspondingly located in the non-opening region of the pixel defining layer; and an orthographic projection of the first sub-layer of the second light emitting unit on the base substrate does not overlap an orthographic projection of the extension portion on the base substrate; or wherein the extension portion is correspondingly located in the non-opening region of the pixel defining layer; the extension portion further extends to a position between the first sub-layer of the second light emitting unit and the pixel defining layer; and an orthographic projection of the first sub-layer of the second light emitting unit on the base substrate partially overlaps an orthographic projection of the extension portion on the base substrate.

5. The display substrate of claim 4, wherein an orthographic projection of the second sub-layer of the second light emitting unit on the base substrate partially overlaps the orthographic projection of the extension portion on the base substrate.

6. The display substrate of claim 1, wherein a closest distance between adjacent boundaries of the first sub-layers of the two adjacent ones of the at least some adjacent light emitting units with different colors is in a range of 1 μm to 5 μm; and/or a closest distance between adjacent boundaries of the second sub-layers of the two adjacent ones of the at least some adjacent light emitting units with different colors is in a range of 1 μm to 5 μm.

7. The display substrate of claim 6, wherein the closest distance between adjacent boundaries of the second sub-layers of the two adjacent ones of the at least some adjacent light emitting units with different colors is in a range of 1.5 μm to 4.5 μm.

8. The display substrate of claim 6, wherein two adjacent ones of the at least some light emitting units have the same color;

a nearest first distance between adjacent boundaries of openings where the two adjacent light emitting units having the same color are located is smaller than a nearest second distance between adjacent boundaries of openings where the two adjacent light emitting units having different colors are located; and a difference between the second distance and the first distance is in a range of 0.5 μm to 2.5 μm.

9. The display substrate of claim 4, wherein a size of the extension portion along a direction where the two adjacent light emitting units with different colors are arranged is in a range of 2 μm to 5 μm.

10. The display substrate of claim 1, wherein each of the plurality of light emitting units comprises an effective light emitting area, which is defined by a corresponding opening of the openings in the pixel defining layer; and an orthographic projection of the effective light emitting area of at least one of the first light emitting unit, the second light emitting unit and the blue light emitting unit on the base substrate is of a rectangle or a rounded rectangle, which satisfies at least one of:

a size of the effective light emitting area of the first light emitting unit in a range of 14.9 μm×9.4 μm to 30.9 μm×24.62 μm;

a size of the effective light emitting area of the second light emitting unit in a range of 12.8 μm×12.8 μm to 28.5 μm×28.5 μm; and a size of the effective light emitting area of the blue light emitting unit in a range of 18.2 μm×18.2 μm to 34.8 μm×34.8 μm.

11. The display substrate of claim 1, wherein the luminescent functional layer further comprises a hole injection layer, a hole transport layer, an electron transport layer, and an electron injection layer, each of which is at least partially on the side of the non-opening region of the pixel defining layer away from the base substrate;

the hole injection layer, the hole transport layer, the first sub-layer, the second sub-layer, the electron transport layer, and the electron injection layer are sequentially stacked away from the anode; and the second sub-layer is an exciton generation-radiative transition layer, and the first sub-layer is a luminescent auxiliary layer.

12. The display substrate of claim 11, wherein the hole transport layer extends to the side of the non-opening region of the pixel defining layer away from the base substrate; and carrier mobilities of the hole transport layers of the two adjacent ones of the at least some light emitting units with different colors are different; and orthographic projections of the hole transport layers of the two adjacent ones of the at least some light emitting units with different colors on the base substrate do not overlap each other.

13. The display substrate of claim 11, wherein the hole transport layers of the plurality of light emitting units extend toward the side of the non-opening region of the pixel defining layer away from the base substrate and are integrally connected to each other as a single piece.

14. The display substrate of claim 13, wherein the hole injection layers of the plurality of light emitting units extend toward the side of the non-opening region of the pixel defining layer away from the base substrate and are integrally connected to each other as a single piece; and/or the electron transport layers of the plurality of light emitting units extend toward the side of the non-opening region of the pixel defining layer away from the base substrate and are integrally connected to each other as a single piece; and/or the electron injection layers of the plurality of light emitting units extend toward the side of the non-opening region of the pixel defining layer away from the base substrate and are integrally connected to each other as a single piece; and/or the cathodes of the plurality of light emitting units extend toward the side of the non-opening region of the pixel defining layer away from the base substrate and are integrally connected to each other as a single piece.

15. The display substrate of claim 12, wherein the luminescent functional layer further comprises a hole blocking layer between the second sub-layer and the electron transport layer; and the hole blocking layers of the plurality of light emitting units extend toward the side of the non-opening region of the pixel defining layer away from the base substrate and are integrally connected to each other as a single piece.

16. The display substrate of claim 15, wherein a thickness of the first sub-layer of the second light emitting unit is greater than that of the first sub-layer of the first light emitting unit; and/or, the thickness of the first sub-layer of the first light emitting unit is greater than that of the first sub-layer of the blue light emitting unit; and/or, a thickness of the second sub-layer of the second light emitting unit is greater than that of the second sub-layer of the first light emitting unit; and/or, the thickness of the second sub-layer of the first light emitting unit is greater than that of the second sub-layer of the blue light emitting unit.

17. The display substrate of claim 16, wherein thicknesses of the hole injection layer, the hole transport layer, the hole blocking layer, the electron transport layer, the electron injection layer, and the cathode of each light emitting unit are uniform in the non-opening region of the pixel defining layer.

18. A display panel, comprising the display substrate of claim 1.

* * * * *